(12) United States Patent
Jaramillo et al.

(10) Patent No.: US 7,666,019 B2
(45) Date of Patent: Feb. 23, 2010

(54) SYSTEM AND METHOD FOR RETAINING A CARD

(75) Inventors: Joel Jaramillo, Austin, TX (US); Alex Rodriguez, Austin, TX (US); Andrew Frisch, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 12/098,535

(22) Filed: Apr. 7, 2008

(65) Prior Publication Data
US 2009/0253288 A1 Oct. 8, 2009

(51) Int. Cl.
*H01R 13/62* (2006.01)
(52) U.S. Cl. .................................... 439/327
(58) Field of Classification Search ............... 439/327, 439/308, 325, 371; 361/801, 802, 759
See application file for complete search history.

(56) References Cited

U.S. PATENT DOCUMENTS

| | | | | |
|---|---|---|---|---|
| 4,435,029 A | * | 3/1984 | McKenzie | 312/332.1 |
| 5,224,016 A | * | 6/1993 | Weisman et al. | 361/728 |
| 5,506,758 A | * | 4/1996 | Cromwell | 361/798 |
| 6,769,927 B2 | * | 8/2004 | Brewer | 439/328 |
| 6,832,927 B2 | | 12/2004 | Wilson et al. | 439/347 |
| 6,934,161 B2 | | 8/2005 | Kim et al. | 361/752 |
| 6,971,900 B2 | * | 12/2005 | Liebenow | 439/327 |
| 7,140,900 B1 | | 11/2006 | Villanueva | 439/327 |

\* cited by examiner

*Primary Examiner*—Edwin A. Leon
*Assistant Examiner*—Vanessa Girardi
(74) *Attorney, Agent, or Firm*—Baker Botts L.L.P.

(57) ABSTRACT

Systems and methods for retaining a card in an information handling system are disclosed. A retainer for use in an information handling system may include a body, at least one mounting feature coupled to the body, and a retention flange coupled to and protruding from the body. The at least one mounting feature may be configured to couple the retainer to a card. The retention flange may have a top edge configured to engage with a bottom edge of a retention ledge associated with a connector to secure the card to the connector. At a least a portion of the top edge of the retention flange of the retainer may be situated in a substantially non-parallel manner relative to the bottom edge of the retention ledge associated with the connector when the retention flange is engaged with the retention ledge.

20 Claims, 3 Drawing Sheets

SYSTEM AND METHOD FOR RETAINING A CARD

TECHNICAL FIELD

The present disclosure relates in general to the field of electrical couplings, and more particularly to systems and methods for improving integrity of electrical couplings between various electronic components of an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often include printed circuit boards and/or electronic cards which may expand and/or enhance the capabilities of the information handling system. Printed circuit boards and/or electronic cards included in an information handling system typically include an edge connector placed along a side of the card for insertion into a corresponding mating connector slot to establish electrical coupling. The card may include a plurality of electronic components including integrated circuit chips operable to perform at least one predefined function. When the card is properly inserted in the slot-type connector, electrical pads mounted on the edge connector of the card may establish an electrical contact with receiving elements mounted within the connector slot. The frictional engagement between the edge connector and the receiving elements in the connector slot may also hold the card in place. Maintaining a proper connection between the card and the slot connector is desirable for a proper operation of the information handling system. In some cases, for added safety, the card and/or the connector may also include an additional mechanical arm or extension for card retention. In some cases, a separate card retention device may be provided to secure the card to the connector. The additional mechanical connection may be made with a screw or other fastening device, and is intended to assist in holding the card in a properly connected position in the respective connector slot.

Cards have traditionally been secured to the connectors by using screws, latches and/or clips. However, the use of fasteners such as screws for card retention generally creates additional component costs and also adds to the overall cost of manufacture and assembly of the information handling system. Some clips used for card retention may require access to an underside surface of the connector for proper mounting. Other approaches include a retention device to engage a feature of the slot connector, but such approaches often require some sort of actuator or lever to disengage the retention device from the slot connector feature.

Recently, some cards such as graphics/video card have an increased component count for performing advanced graphics, thereby becoming heavier and larger. The graphics cards may be available in multiple form factors and often occupy two connector slots instead of one. Thus, traditional card retention techniques may be inadequate and/or may become costly to maintain security of the electrical coupling between the card and the connector included in an information handling system, especially while the information handling system is being physically moved.

SUMMARY

In accordance with the teachings of the present disclosure, disadvantages and problems associated with maintaining and/or securing cards in an information handling system.

In accordance with one embodiment of the present disclosure, a retainer for use in an information handling system may include a body, at least one mounting feature coupled to the body, and a retention flange coupled to and protruding from the body. The at least one mounting feature may be configured to couple the retainer to a card. The retention flange may have a top edge configured to engage with a bottom edge of a retention ledge associated with a connector to secure the card to the connector. At a least a portion of the top edge of the retention flange of the retainer may be situated in a substantially non-parallel manner relative to the bottom edge of the retention ledge associated with the connector when the retention flange is engaged with the retention ledge.

In accordance with another embodiment of the present disclosure, a card for use in an information handling system may include a surface, one or more electronic components mounted to the surface, and a retainer. The one or more electronic components may be configured to perform at least one predefined function. The retainer may include a body, at least one mounting feature coupled to the body, and a retention flange coupled to and protruding from the body. The at least one mounting feature may be configured to couple the retainer to the surface. The retention flange may have a top edge configured to engage with a bottom edge of a retention ledge associated with a connector to secure the card to the connector. At a least a portion of the top edge may be situated in a substantially non-parallel manner relative to the bottom edge of the retention ledge associated with the connector when the retention flange is engaged with the retention ledge.

In accordance with an additional embodiment of the present disclosure, an information handling system may include a processor, a memory communicatively coupled to the processor, a card configured to perform at least one predefined function, a connector configured to communicatively couple the card to the processor and a retainer mounted to the card. The connector may have a retention ledge. The retainer may be mounted to the card and may include a body, at least one mounting feature coupled to the body, and a retention flange coupled to and protruding from the body. The at least one mounting feature may be configured to couple the retainer to a surface of the card. The retention flange may have a top edge configured to engage with a bottom edge of the retention ledge to secure the card to the connector. At a least a portion of the top edge may be situated in a substantially non-parallel manner relative to the bottom edge of the retention ledge associated with the connector when the retention flange is engaged with the retention ledge.

In accordance with a further embodiment of the present disclosure, a method for retaining a card is provided. The method may include inserting a card into a connector to electrically couple the card and the connector. The method may also include engaging a retainer mounted to the card with a retention ledge associated with the connector, the retainer including a body and a retention flange coupled to and protruding from the body, wherein at least one feature configured such that at a least a portion of a top edge of the retention flange engages with a bottom edge of retention ledge such that the top edge of the retention flange is situated in a substantially non-parallel manner relative to the bottom edge of the retention ledge.

Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
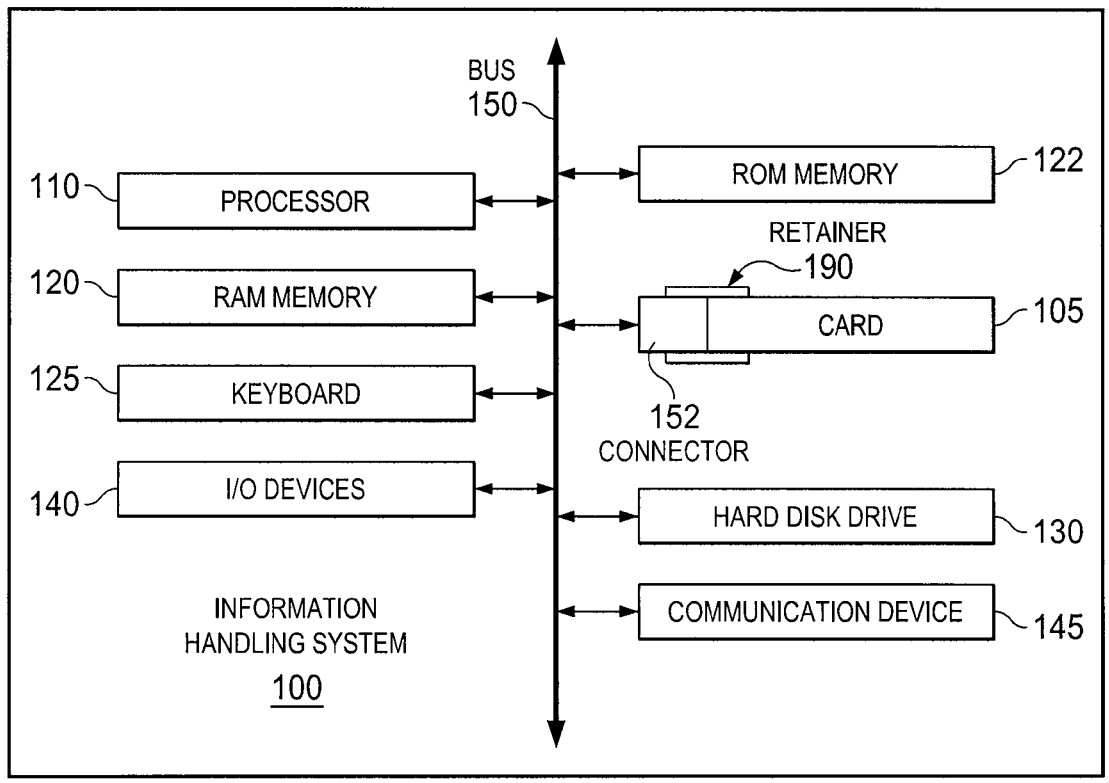
FIG. 1 illustrates a block diagram of an example information handling system having a card with a card retainer, in accordance with the present disclosure.
Figure 3:
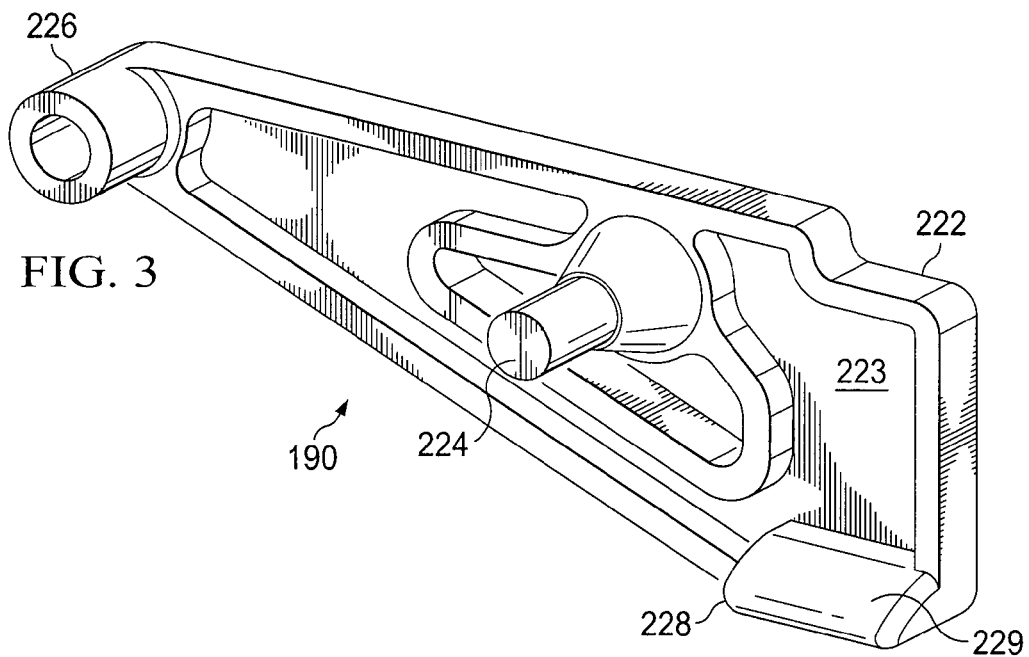
FIG. 3 illustrates a perspective view of the retainer depicted in FIGS. 2A and 2B separated from the card depicted in FIGS. 2A and 2B, in accordance with the present disclosure.

Preferred embodiments and their advantages are best understood by reference to FIGS. 1-3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory, as well as communications media such wires, optical fibers, microwaves, radio waves, and other electromagnetic and/or optical carriers; and/or any combination of the foregoing.

FIG. 1 illustrates a block diagram of an example information handling system 100 having a card 105 with a card retainer 190, in accordance with the present disclosure. Information handling system 100 may include a processor 110, a system random access memory (RAM) 120 (also referred to as main memory), a non-volatile ROM 122 memory, a card 105, a keyboard 125, and an I/O controller 140 for controlling various other input/output devices. For example, the I/O controller 140 may include a keyboard controller, a cursor device controller, and/or the serial I/O controller. In some embodiments information handling system 100 may include or be coupled to a display device (e.g., card 105 may be a display controller coupling the display device to bus 150).

Information handling system 100 is shown to include a hard disk drive 130 connected to the processor 110, although some embodiments may not include a hard disk drive 130. In certain embodiments, information handling system 100 may include additional hard disks. Processor 110 may communicate with one or more components of information handling system 100 via a bus 150, which may include data, address, and control lines. In one embodiment, information handling system 100 may include multiple instances of bus 150. A communications device 145, for example, a network interface card and/or a radio device, may be connected to the bus 150 to enable wired and/or wireless information exchange between information handling system 100 and other devices.

Processor 110 may be configured to execute the computing instructions and/or operations of information handling system 100. A computer-readable medium, e.g., RAM 120 or ROM 122, may store instructions (also known as a "software program" or a "program of instructions") for implementing various embodiments of a method in accordance with the present disclosure. For example, an operating system (OS) of information handling system 100 may control execution of other software programs, referred to as application software programs. In various embodiments the instructions and/or software programs may be implemented in various ways, including procedure-based techniques, component-based techniques, and/or object-oriented techniques, among others. Specific examples include assembler, C, XML, C++ objects, Java and Microsoft's NET technology.

In a particular embodiment, card 105 may be communicatively coupled to processor 110 via bus 150 and a connector 152. A card retainer 190 (also referred to herein simply as a retainer) may be coupled and/or mounted to the card 105 and may be configured to engage connector 152 in order to retain card 105 in connector 152. That is, the retainer 190 is intended to assist in holding the display controller 105 in a properly connected position in the slot of the connector 152. Additional detail of the retainer 190 is described with reference to FIGS. 2A, 2B, and 3 below.

Figure 2A:
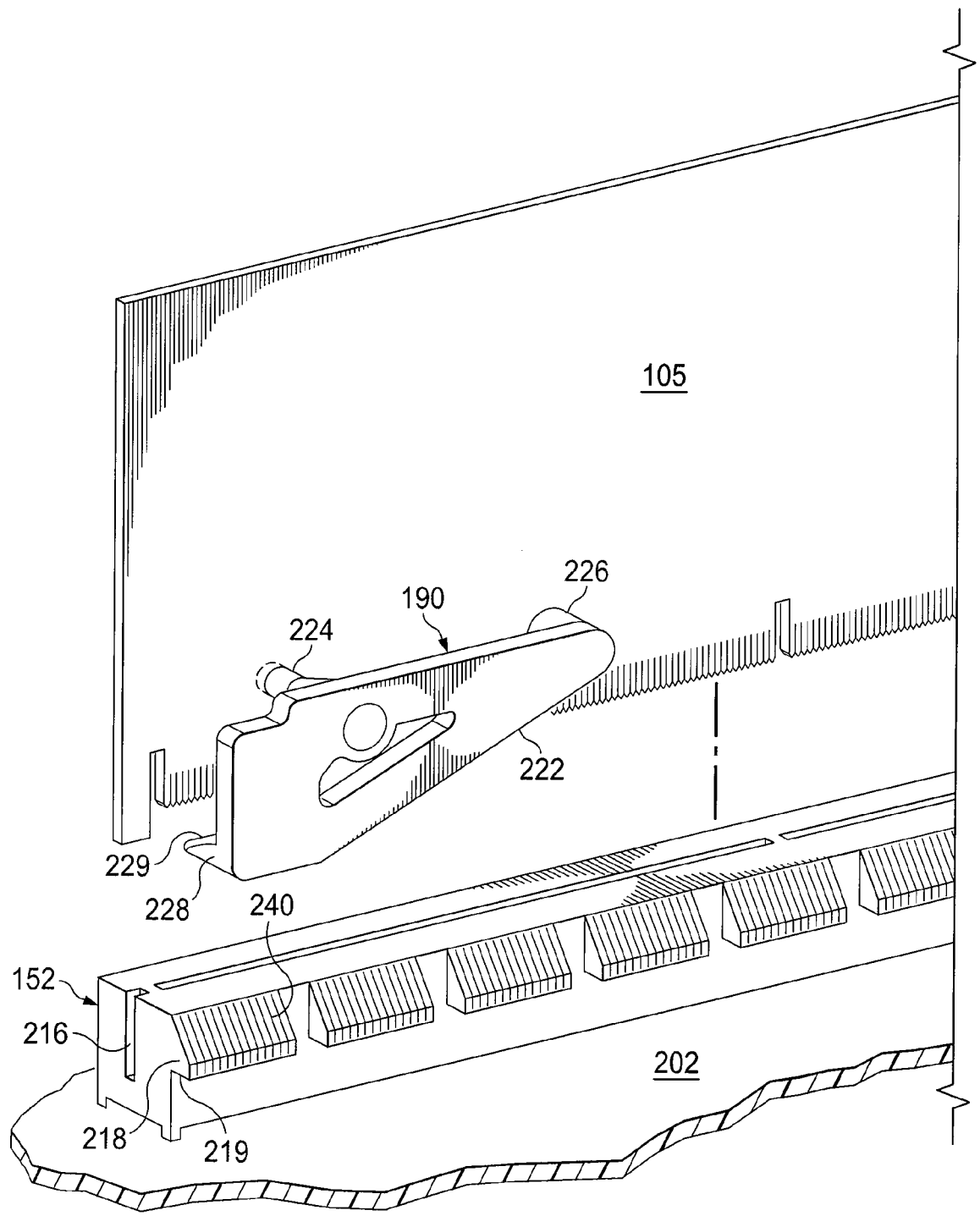
FIG. 2A illustrates a perspective view of a card having a retainer prior to the card being engaged with a connector, in accordance with the present disclosure.
Figure 2B:
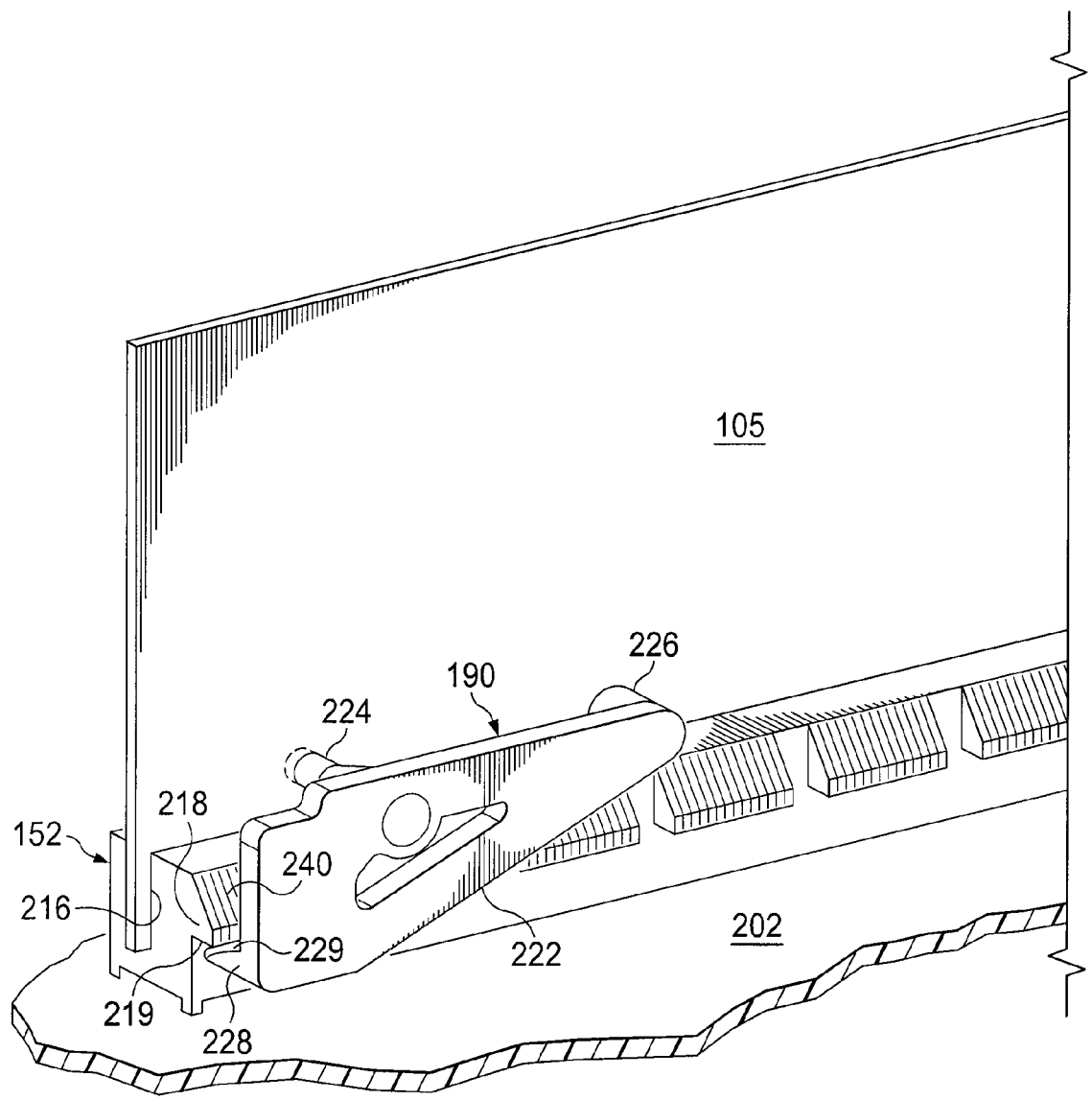
FIG. 2B illustrates a perspective view of the card of FIG. 2A after the card has been engaged with the connector, in accordance with the present disclosure.

FIG. 2A illustrates a view in perspective of a card 105 having retainer 190 prior to card 105 being engaged with connector 152, in accordance with the present disclosure. FIG. 2B illustrates a view in perspective of card 105 having retainer 190 after card 105 has been engaged with connector 152, in accordance with the present disclosure. FIG. 3 illustrates a view in perspective of retainer 190 depicted in FIGS. 2A and 2B separated or demounted from card 105, in accordance with the present disclosure. Card 105 may be any suitable electronic card (e.g., a display controller and/or other suitable card).

As depicted in FIGS. 2A and 2B, connector 152 may be mounted on a printed circuit board (PCB) 202 (e.g., an information handling system motherboard). As shown in FIGS. 2A and 2B, connector 152 may have a generally rectangular prism or cuboid shape. Connector 152 may include a slot 216 configured to removably receive corresponding mating edge connectors of card 105. That is, in an inserted position, card 105 may be adapted to stand on-edge in slot 216 of the connector 152.

Connector 152 and/or its associated slot 216 may also include a predefined form factor. Specific properties of connector 152 such as number of connections (or pins) and dimensions may vary depending on the manufacturer and/or an industry standard. In a particular embodiment, connector 152 is in accordance with a peripheral component interconnect express (PCIe) standard. The PCIe standard provides a variety of selectable form factors such as X1, X4, X8, X16, X32 and X64 to match desired performance and sizing features. For example, in many video and graphics applications, graphics cards may use the X16 form factor for connector 152 supporting 164 pins/connections. It is contemplated that the connector 152 may be in accordance with other standards and form factors, including proprietary and/or non-industry standard form factors.

As shown in FIGS. 2A and 2B, connector 152 may also include a retention ledge 218. Retention ledge 218 may be adapted to engage a retaining feature (e.g., retainer 190) at a bottom edge 219 of retention ledge 218 to allow secure engagement of card 105 to connector 152.

As depicted in FIGS. 2A and 2B, card 105 may be coupled and/or mounted to retainer 190. In certain embodiments, retainer 190 may be formed from a suitable plastic material such has nylon. As shown in FIGS. 2A, 2B and 3, retainer 190 may include one or more mounting features 224 and 226, retention flange 228, and a web or body 222 coupling mounting features 224, 226 and retention flange 228 to one another.

Mounting features 224 and 226 may include any suitable apparatus, device, or system configured to couple retainer 190 to card 105. For example, mounting feature 226 may include a protrusion from a face 223 of body 222 such that the protrusion is coupled to card 105 by an adhesive (e.g., epoxy, glue) and/or a fastener (e.g., screw, bolt) or may be formed integrally with body 222. As another example, mounting feature 224 may include a protrusion that may mate with a corresponding feature (e.g., a hole) of card 105 configured to receive the protrusion. In such embodiments, a portion of mounting feature 224 may protrude through the corresponding feature of card 105 to permit a user to push the protrusion back through the corresponding feature in order to disengage retainer 190 from retention ledge 218 (as described in greater detail below). Although a specific number and a specific type of mounting features 224 and 226 are depicted in FIGS. 2A, 2B and 3, any suitable number and/or types of mounting features 224 and 226 may be utilized.

Retention flange 228 may include any suitable apparatus, device, or system configured to engage retainer 190 with retention ledge 218. For example, in the embodiments shown in FIG. 2B, retention flange 228 may be configured such that top edge 229 of retention flange 228 engages with bottom edge 219 of retention ledge 218 in order to secure card 105 in slot 216. In some embodiments, top edge 229 may be substantially flat or planar. In other embodiments, top edge 229 may be curved or convex in shape. In these and other embodiments, top edge 229 may form a substantially obtuse angle with face 223 of body 222, thus permitting top edge 229 to be situated in a substantially non-parallel manner to bottom edge 219 when retention flange 228 is engaged with retention ledge 218.

Body 222 may be any suitable apparatus, device, or system configured to couple mounting features 224 and 226 to retention flange 228. In certain embodiments, body 222 may be substantially rigid, but flexible enough to permit suitable deflection such that retainer 190 may engage and disengage with retention ledge 218. In these or other embodiments, the physical properties of body 222 may "bias" body 222 such that the face 223 of body 222 is generally flat, but may bend or deflect when sufficient force is applied to allow engagement and disengagement of retainer 190 and retention ledge 218.

In operation, a user, technician, or other person may engage card 105 with connector 152 by sliding the edge connector of card 105 into slot 216. Such action may cause retention flange 228 to slide over the sloped surface 240 of retention ledge 218 until retention flange 228 engages with retention ledge 218, securing card 105 in connector 152. In some embodiments, body 222 may flex outwardly as retention flange 228 slides over sloped surface 240 of retention ledge 218. Securing card 105 in connector 152 by the interaction of retention flange 228 and retention ledge 218 may reduce or eliminate the possibility of the card becoming unseated from connector 152 when an information handling system 100 include card 105 is moved or transported.

If a user, technician, or other person desires to remove the card 105 from connector 152, such person may do so by applying an extraction force to the card sufficient to cause adequate deflection of body 222 to disengage retention flange 228 from retention ledge 218. The threshold extraction force required to disengage retention flange 228 from retention ledge 218 may depend at least in part on an angle of top edge 229 of retention flange 228 relative to face 223 of body 222 (e.g., the force required may be inversely proportional to the size of the angle) and/or the convexity of top edge 229 (e.g., the force required may be inversely proportional to the degree of convexity). Accordingly, a designer or manufacturer of retainer 190 may be able to tune the extraction force required to unseat card 105 from connector 152 such that routine transportation of an information handling system does not cause the card to unseat, but that sufficient force applied by a person will cause card 105 to disengage from connector 152. In certain embodiments, the extraction force threshold may be tuned according to the expected end user (e.g., a low-force threshold may used for information handling systems intended for personal use while a high-force threshold may be used for information handling systems intended for use by experts or technicians).

Using the methods and systems disclosed herein, problems associated conventional approaches to retaining cards have been reduced or eliminated. For example, the systems and methods disclosed herein allow for retention of a card in a connector without the need of a separate actuation mechanism to disengage the retainer, as is present in many traditional approaches. In addition, the approach set forth in this disclosure may be more "user-friendly," in the sense that an unskilled user not familiar with traditional retention mechanisms may remove a card in a fairly intuitive manner (i.e., by simply pulling on the card with the required force). Such increased user-friendliness may reduce the occurrence of damage caused by unskilled users.

Although the present disclosure has been described in detail, it should be understood that various changes, substitutions, and alterations can be made hereto without departing from the spirit and the scope of the invention as defined by the appended claims.

What is claimed is:

1. A retainer for use in an information handling system, comprising:
    a substantially rigid, yet flexible body;
    at least one mounting feature coupled to the body and configured to couple the retainer to a card; and
    a retention flange coupled to and protruding from the body, the retention flange having a top edge configured to engage with a bottom edge of a retention ledge associated with a connector to secure the card to the connector;
    wherein at a least a portion of the top edge of the retention flange of the retainer is situated in a substantially non-parallel manner relative to the bottom edge of the retention ledge associated with the connector when the retention flange is engaged with the retention ledge; and
    wherein the body is configured to deflect during engagement of the retention flange with the retention ledge such that the retention flange moves relative to the at least one mounting feature during application of insertion and extraction forces applied to the card.

2. A retainer according to claim 1, wherein the at least one mounting feature is configured to fixedly couple the retainer to the card.

3. A retainer according to claim 1, wherein the top edge of the retention flange is convex relative to the bottom edge of the retention ledge when the retention flange is engaged with the retention ledge.

4. A retainer according to claim 3, wherein the convexity is configured such that a particular extraction force is required to disengage the retention flange from the retention ledge.

5. A retainer according to claim 1, wherein the top edge of the retention flange forms a substantially obtuse angle with a face of the body.

6. A retainer according to claim 5, wherein the substantially obtuse angle is configured such that a particular extraction force is required to disengage the retention flange from the retention ledge.

7. A card for use in an information handling system, comprising:
    a surface;
    one or more electronic components mounted to the surface and configured to perform at least one predefined function; and
    a retainer including:
        a substantially rigid, yet flexible body;
        at least one mounting feature coupled to the body and configured to couple the retainer to the surface;
        a retention flange coupled to and protruding from the body, the retention flange having a top edge configured to engage with a bottom edge of a retention ledge associated with a connector to secure the card to the connector;
        wherein at a least a portion of the top edge is situated in a substantially non- parallel manner relative to the bottom edge of the retention ledge associated with the connector when the retention flange is engaged with the retention ledge; and
        wherein the body is configured to deflect during engagement of the retention flange with the retention ledge such that the retention flange moves relative to the at least one mounting feature during application of insertion and extraction forces applied to the card.

8. A card according to claim 7, wherein the at least one mounting feature is configured to fixedly couple the retainer to the surface.

9. A card according to claim 7, wherein the top edge of the retention flange is convex relative to the bottom edge of the retention ledge when the retention flange is engaged with the retention ledge.

10. A card according to claim 9, wherein the convexity is configured such that a particular extraction force is required to disengage the retention flange from the retention ledge.

11. A card according to claim 7, wherein the top edge of the retention flange forms a substantially obtuse angle with a face of the body.

12. A card according to claim 11, wherein the substantially obtuse angle is configured such that a particular extraction force is required to disengage the retention flange from the retention ledge.

13. An information handling system, comprising:
    a processor;
    a memory communicatively coupled to the processor;
    a card configured to perform at least one predefined function and having one or more mating edge connectors;
    a connector configured to communicatively couple the card to the processor, the connector having a retention ledge; and
    a retainer mounted to the card and including:
        a substantially rigid, yet flexible body;
        at least one mounting feature coupled to the body and configured to couple the retainer to a surface of the card;
        a retention flange coupled to and protruding from the body, the retention flange having a top edge configured to engage with a bottom edge of the retention ledge to secure the card to the connector;
        wherein at a least a portion of the top edge is situated in a substantially non/parallel manner relative to the bottom edge of the retention ledge associated with the connector when the retention flange is engaged with the retention ledge; and
        wherein the body is configured to deflect during engagement of the retention flange with the retention ledge such that the retention flange moves relative to the at least one mounting feature during application of insertion and extraction forces applied to the card.

14. An information handling system according to claim 13, wherein the at least one mounting feature configured to fixedly couple the retainer to the surface.

15. An information handling system according to claim 13, wherein the top edge is convex relative to the bottom edge of the retention ledge when the retention flange is engaged with the retention ledge.

16. An information handling system according to claim 15, wherein the convexity is configured such that a particular extraction force is required to disengage the retention flange from the retention ledge.

17. An information handling system according to claim 13, wherein the top edge of the retention flange forms a substantially obtuse angle with a face of the body.

18. An information handling system according to claim 17, wherein the substantially obtuse angle is configured such that a particular extraction force is required to disengage the retention flange from the retention ledge.

19. A method for retaining a card, comprising:
    inserting a card into a connector to electrically couple the card and the connector; and
    engaging a retainer mounted to the card with a retention ledge associated with the connector, the retainer including a substantially rigid, yet flexible body and a retention flange coupled to and protruding from the body, wherein at least one feature configured such that at a least a portion of a top edge of the retention flange engages with a bottom edge of retention ledge such that the top edge of the retention flange is situated in a substantially non-parallel manner relative to the bottom edge of the retention ledge and wherein the body is configured to deflect during engagement of the retention flange with the retention ledge such that the retention flange moves relative to at least one mounting feature during application of insertion and extraction forces applied to the card.

20. A method according to claim 19, wherein the top edge of the retention flange: (a) is convex relative to the bottom edge of the retention ledge when the retention flange is engaged with the retention ledge, or (b) forms a substantially obtuse angle with a face of the body.

* * * * *